(12) United States Patent
Paranto et al.

(10) Patent No.: US 10,900,755 B1
(45) Date of Patent: Jan. 26, 2021

(54) LASER WEAPON SYSTEM

(71) Applicant: Applied Research Associates, Inc., Albuquerque, NM (US)

(72) Inventors: Joseph Nolan Paranto, Albuquerque, NM (US); Christopher Scott Church, Albuquerque, NM (US)

(73) Assignee: Applied Research Associates, Inc., Albuquerque, NM (US)

( * ) Notice: Subject to any disclaimer, the term of this patent is extended or adjusted under 35 U.S.C. 154(b) by 32 days.

(21) Appl. No.: 16/448,734

(22) Filed: Jun. 21, 2019

Related U.S. Application Data

(60) Provisional application No. 62/690,067, filed on Jun. 26, 2018.

(51) Int. Cl.
    *F41H 13/00* (2006.01)

(52) U.S. Cl.
    CPC ....... *F41H 13/005* (2013.01); *F41H 13/0043* (2013.01); *F41H 13/0062* (2013.01)

(58) Field of Classification Search
    CPC ............... F41H 13/0062; F41H 13/005; F41H 13/0043; F41H 13/00
    See application file for complete search history.

(56) References Cited

U.S. PATENT DOCUMENTS

| | | | |
|---|---|---|---|
| 3,392,259 A * | 7/1968 | Meier | B23K 26/0096 219/121.6 |
| 5,272,716 A * | 12/1993 | Soltz | A61B 18/20 219/121.6 |
| 6,700,094 B1 * | 3/2004 | Kuntze | B41J 3/36 219/121.6 |
| 7,397,014 B2 * | 7/2008 | Hart | B23K 26/08 219/121.68 |
| 7,784,390 B1 * | 8/2010 | Lowell | F41H 13/0068 89/1.11 |
| 8,049,173 B1 * | 11/2011 | Brown | H01Q 1/3275 250/341.7 |
| 9,170,075 B2 * | 10/2015 | Kangas | F41H 13/005 |
| 9,303,958 B2 * | 4/2016 | Conemac | H01S 5/02208 |
| 10,574,384 B2 * | 2/2020 | Morrow | H04K 3/41 |
| 2004/0200341 A1 * | 10/2004 | Walters | F41H 13/0062 89/1.13 |
| 2007/0040725 A1 * | 2/2007 | Lowell | F41C 7/00 342/13 |
| 2009/0052475 A1 * | 2/2009 | Nachshon | F41H 11/32 372/6 |
| 2011/0000123 A1 * | 1/2011 | Taufman | F41A 9/71 42/114 |
| 2011/0020173 A1 * | 1/2011 | Pryor | A61N 5/0603 422/3 |
| 2011/0024405 A1 * | 2/2011 | Bradley | B23K 26/702 219/121.72 |
| 2011/0113949 A1 * | 5/2011 | Bradley | F41H 13/0056 89/1.11 |
| 2012/0075843 A1 * | 3/2012 | Battis | F41H 13/0056 362/157 |

(Continued)

*Primary Examiner* — Joshua E Freeman
(74) *Attorney, Agent, or Firm* — Erise IP, P.A.

(57) ABSTRACT

A laser weapon system is described. Particularly, embodiments describe subsystems of a laser weapon system including those necessary for laser generation, operational control, optical emission, and heat dissipation configured to provide a lightweight unit of reduced dimensions.

25 Claims, 8 Drawing Sheets

(56) References Cited

U.S. PATENT DOCUMENTS

| | | | | |
|---|---|---|---|---|
| 2012/0101658 A1* | 4/2012 | Bradley | ............... | G01S 3/782 |
| | | | | 701/2 |
| 2012/0185115 A1* | 7/2012 | Dean | ............... | F41H 7/005 |
| | | | | 701/2 |
| 2012/0247117 A1* | 10/2012 | Gagne | ............... | F02C 3/04 |
| | | | | 60/772 |
| 2012/0292481 A1* | 11/2012 | Hutchin | ............... | G01S 17/89 |
| | | | | 250/201.9 |
| 2012/0300803 A1* | 11/2012 | Kangas | ............... | F41H 13/005 |
| | | | | 372/34 |
| 2013/0061509 A1* | 3/2013 | Allen | ............... | F41G 1/35 |
| | | | | 42/115 |
| 2015/0285599 A1* | 10/2015 | Downing | ............... | F41G 9/00 |
| | | | | 89/1.11 |
| 2015/0369570 A1* | 12/2015 | Conemac | ............... | F41H 13/0062 |
| | | | | 359/639 |
| 2016/0067827 A1* | 3/2016 | Zediker | ............... | B23K 26/144 |
| | | | | 219/76.12 |
| 2016/0097616 A1* | 4/2016 | Weigold | ............... | F41H 13/0062 |
| | | | | 250/396 R |
| 2017/0127507 A1* | 5/2017 | Hunt | ............... | H05H 1/46 |
| 2017/0234658 A1* | 8/2017 | Segev | ............... | F41H 13/0062 |
| | | | | 250/203.2 |
| 2017/0354465 A1* | 12/2017 | Rink | ............... | A61B 90/98 |
| 2018/0080747 A1* | 3/2018 | Nishikata | ............... | H05H 1/24 |
| 2018/0219349 A1* | 8/2018 | Lemire | ............... | F41J 5/00 |
| 2018/0254592 A1* | 9/2018 | Serbicki | ............... | H01S 5/4037 |
| 2020/0096296 A1* | 3/2020 | Rigby | ............... | F41G 3/065 |
| 2020/0141704 A1* | 5/2020 | Rigby | ............... | F41G 3/04 |

* cited by examiner

LASER WEAPON SYSTEM

RELATED APPLICATIONS

This non-provisional patent application claims priority benefit, with regard to all common subject matter, of earlier-filed U.S. Provisional Patent Application No. 62/690,067, filed Jun. 26, 2018. The identified earlier-filed provisional patent application is hereby incorporated by reference in its entirety into the present application.

BACKGROUND

1. Field

Embodiments of the invention are broadly directed to systems and methods of producing a laser for a system that has reduced size and weight. Specifically, embodiments of the invention address limitations caused by the weight, power consumption, and heat mitigation requirements to enable a weaponized laser generation system that is light enough to be at least partially carried by one or more humans.

2. Related Art

Modern laser weapons systems provide an array of powerful tactical abilities. Specifically, laser weapons are particularly valuable to counter-explosive applications, such as detonation of unexploded ordinance (UXO), improvised explosive devices (IEDs), or mines, counter-infrastructure applications, such as destroying target communications systems, cameras, power systems, radar, lights, power systems, or locks, and counter-moving-target applications, such as incapacitating or destroying airborne, terrestrial, or maritime unmanned drones. These are only a handful of examples in which a laser weapon system provides a powerful tool in tactical operations that may be superior in performance, speed, safety, and stealth to other weapons.

As a specific example, thermal energy from an incident laser beam can be used to heat explosives from a distance. As the outer target housing of the target heats up and begins to melt, the inner surface reaches its "flash point", causing the unwanted explosive to begin a low order detonation. Using thermal energy from a distance to detonate the target may provide multiple advantages over other methods, such as attempting to shoot and detonate the explosive using a rifle, or detonating the target using C-4 explosive, either of which approaches take more time and may present increased danger.

However, such laser weapon systems are traditionally both very large and very heavy due to the many subsystems required to generate, power, and focus the laser, as well as subsystems controlling the operation of the overall system and mitigating its considerable heat production. As a result, currently existing systems are either immobile or mounted to large vehicles, such as a Mine-Resistant Ambush Protected ("MRAP") tactical vehicle used by the United States Military. This is costly, conspicuous, and may be undesirable for operations in which a vehicle is unwanted or those taking place in areas where vehicular traffic is unavailable. Accordingly, there is a need for systems and methodologies allowing for generation of an intense, controlled laser capable of damaging targets from a distance that require a reduced size and/or weight, enabling the system to be used in a wider array of locations and scenarios.

SUMMARY

Embodiments of the invention address this need by generating lasers using systems, methods, and configurations configured to reduce the size and weight of the system while maximizing utilization of power and heat mitigation resources. Embodiments of the invention may further include steps of implementing one or more modes of power utilization activating particular subsystems and/or deactivating others. Embodiments may include removable subsystems for managing the laser weapon system in a safe, convenient manner that improves the uptime of the weapon. Embodiments of the invention further include various subsystems for powering, generating, focusing, and emitting the laser, as well as subsystems for heat mitigation and computerized control of the system.

In a first embodiment, a laser weapon system includes a laser generation module comprising a diode, such as one or more laser pump diodes. The laser generation module may be connected via fiber optic cable to an emitting unit configured to direct a generated laser towards a target. Heat is exchanged from the laser generation module into a coolant, which may then release heat into an at least partially solid phase change material, contributing to its melting. Coolants used in embodiments may be alcohol or water based, but this is not intended as limiting. Any appropriate coolant may be utilized in embodiments. The system further comprises a chiller for increasing a rate at which heat is exhausted from the system, contributing to the freezing of the phase change material for subsequent remelting by the waste heat of the system. The system may be carried by one or more people, possibly in tandem with an autonomous or semi-autonomous vehicle. The system may further include a control module portion that may be communicatively coupled to the carried portion of the system to enable a user to manage functionality and/or monitor various measurable variables of the system, such as the temperature of particular components, a selected power utilization mode, or a remaining charge level.

In a second embodiment, a laser weapon system comprises a carried body including a processor configured for control of the laser weapon system, a laser generation module comprising a diode, and a heat mitigation module utilizing heat received from the laser generation module to at least partially convert a phase change material from a solid form to a liquid form. The system further comprises an emitting unit with a lens coupled via fiber optic cable to the laser generation module. The system may physically couple with one or more removable cooling pods containing phase change material and/or removable batteries. The removable cooling pod(s) and/or system as a whole may integrate (or "dock") with a chiller that is not part of the carried body to "recharge" the cooling power of the pod(s) by increasing the rate at which the phase change material freezes to its solid form. That is, a chiller separate from a portion carried by a user may be used to freeze some or all of the phase change material within one or more removable cooling pods. In such an embodiment, a secondary chiller may or may not be included with the portion of the system carried by the user. The laser may be generated in response to manual actuation of an activation mechanism, such as a trigger, button, or plunger, and may require an arming authorization such as a physical key, biometric input, and/or passcode before activating.

In a third embodiment, a laser weapon system comprises a laser generation module comprising a diode (for example, pump diodes), a heat mitigation module comprising a phase change material, a chiller in thermal contact with the heat mitigation module, and a control module comprising a processor. The processor is configured to implement one of a plurality of power utilization modes, including a firing mode in which the laser generation module actively generating a laser and the chiller is only passively cooling, and a thermal correction mode in which the laser generation module is dormant, not generating a laser, and the chiller is actively cooling the phase change material to increase the rate at which it freezes to its solid form. The processor may further be configured to implement a high power usage mode in which the laser generation is actively generating a laser and the chiller is actively cooling the phase change material to increase the rate at which it freezes to its solid form, a mode which may require a user's manual selection to initiate. Other triggers of mode changes may include expiration of a timer, reduction of battery charge below a given threshold, and/or receiving a signal that a portion of the system has surpassed a temperature threshold.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the invention are described in detail below with reference to the attached drawing figures, wherein.

Figure 1:
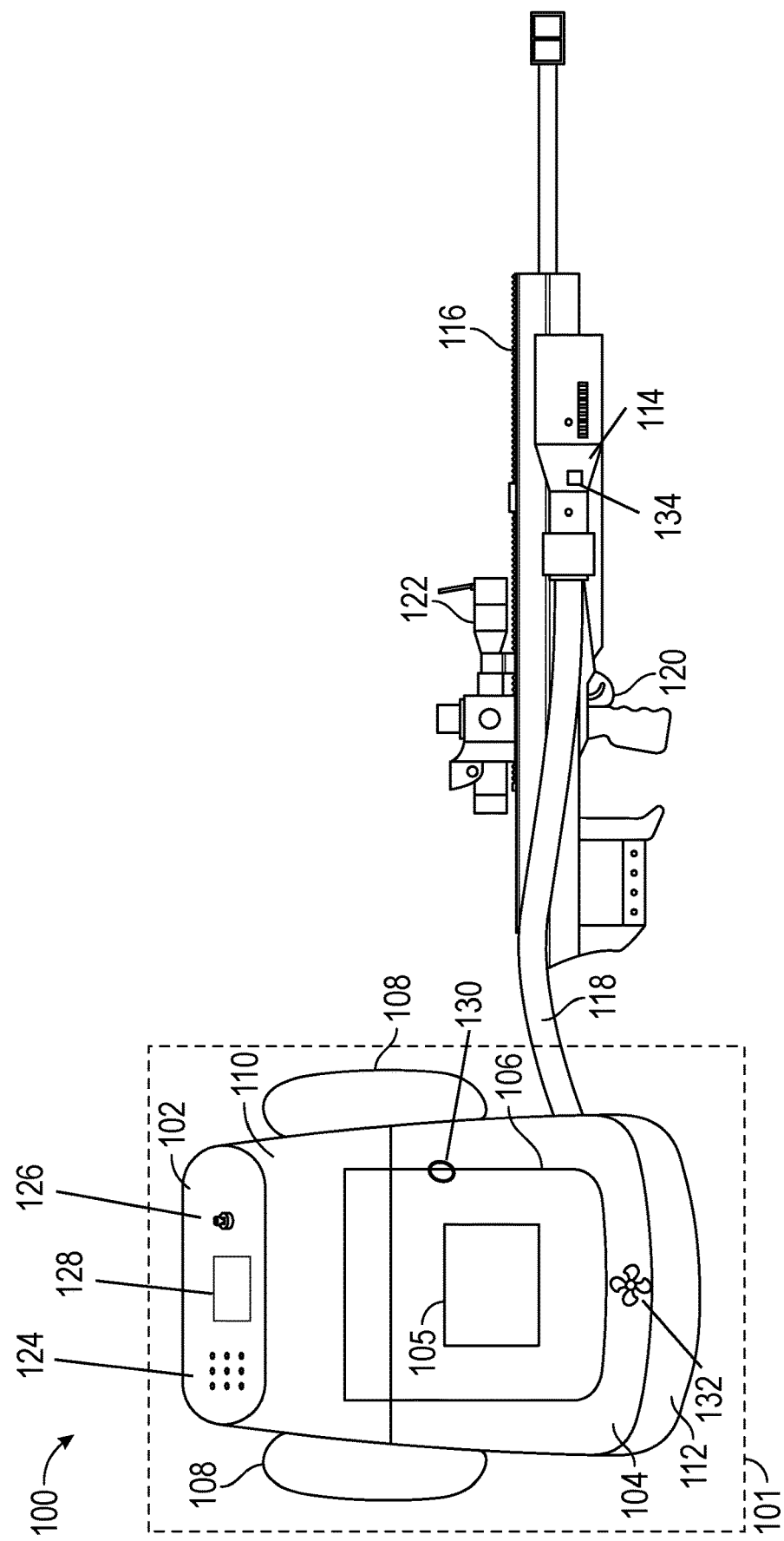
FIG. 1 depicts an exemplary hardware platform for certain embodiments of the invention.

The drawing figures do not limit the invention to the specific embodiments disclosed and described herein. The drawings are not necessarily to scale, emphasis instead being placed upon clearly illustrating the principles of the invention.

DETAILED DESCRIPTION

Embodiments of the invention are directed to systems and methods for generating, focusing, and emitting a laser beam capable of damaging targets from a distance. Embodiments include subsystems for powering, generating, focusing, and emitting the laser, as well as subsystems for heat mitigation and computerized control of the system. Embodiments of the invention may further be carried by a single person, perhaps in a backpack, may be carried by multiple people, or may be carried by one or more people cooperatively with one or more vehicles, which may or may not be autonomous or semi-autonomous. These examples are not intended as limiting. Any embodiment providing the structures and/or employing the methods described herein for a laser weapon system with reduced size and weight is intended for inclusion in embodiments of the invention.

Generally, the sophisticated subsystems necessary for powering, generating, and maintaining a laser beam of sufficient intensity for damaging targets, including "hard" targets comprised of metal, necessitate a large, heavy, and/or completely immobile system. Exacerbating the obstacles of size and weight is the excessive heat generated by the system, primarily produced by the module responsible for generation of the laser. Without proper mitigation, the produced heat could quickly cause failure of the laser weapon system, possibly catastrophically so, which could endanger the user(s) of the system, the goals of the mission for which the weapon is being used, and/or the integrity of the weapon system itself. This "waste" heat from the laser generation module can build up very quickly unless a powerful heat mitigation subsystem is provided, significantly adding to the size and weight to be transported. For these reasons, the most mobile versions of conventional laser weapon systems are typically integrated or affixed to a large terrestrial platform, such as a traditional diesel-powered wheeled vehicle.

If the weight and size of the required subsystems could be significantly reduced or offloaded to a secondary location, the laser weapon system could be provided in a form that could be carried, perhaps by a single person. This would allow the system to be used in locations, situations, and missions in which a vehicle is unavailable or undesirable. For example, an entire laser weapon system could be integrated into a backpack for convenience and comfort. A carried laser weapon system would provide valuable tactical abilities in multiple applications, such as detonation of unexploded ordinance or IEDs, ranged sabotage of infrastructures, and/or neutralization of unwanted aerial surveillance drones. These applications are merely exemplary and are intended neither as limiting nor exhaustive. Currently, the sheer size and weight of laser weapons systems prevent the value of a weaponized laser from becoming fully realized.

Embodiments of the invention first address these issues by providing configurations of subsystems that generate damaging lasers in a lightweight platform of reduced size, such that portions of the system may be carried by a person. Embodiments further may offload portions of the laser weapon system from the portion to be carried, minimizing the burden on the carrier(s). Embodiments further may mitigate heat using systems, methods, and/or modes of operation that reduce the peak power consumption of the system, lowering the weight to be carried by necessitating less only a smaller, lighter power source. This description is intended as an example of embodiments of the invention and is not intended to be limiting.

The subject matter of embodiments of the invention is described in detail below to meet statutory requirements; however, the description itself is not intended to limit the scope of claims. Rather, the claimed subject matter might be embodied in other ways to include different elements, structures, steps, or combinations of steps similar to the ones described in this document, in conjunction with other present or future technologies. Minor variations from the description below are intended to be captured within the scope of the claimed invention. Terms should not be interpreted as implying any particular ordering of various steps described unless the order of individual steps is explicitly described.

The following detailed description of embodiments of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the invention. The following detailed description is, therefore, not to be taken in a limiting sense. The scope of embodiments of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate reference to "one embodiment" "an embodiment", or "embodiments" in this description do not necessarily refer to the same embodiment and are also not mutually exclusive unless so stated and/or except as will be readily apparent to those skilled in the art from the description. For example, a feature, structure, or act described in one embodiment may also be included in other embodiments but is not necessarily included. Thus, the technology can include a variety of combinations and/or integrations of the embodiments described herein.

Operational Environment for Embodiments of the Invention

Turning first to FIG. 1, an exemplary platform that can form an element of certain embodiments of the invention is depicted. In some embodiments, certain components may be arranged differently or absent. Additional components may also be present. A laser weapon system 100 is illustrated in an embodiment that a single person may be capable of carrying on their back. This is not intended as limiting—embodiments may be carried on any part of a single person, split amongst multiple people, partially or wholly carried by manually-driving, autonomous, or semi-autonomous vehicles, wholly or partially borne by an animal, or otherwise mobilized via any suitable structures. In some embodiments, a laser weapon system may be sized and shaped such that it may be integrated within a military-issued backpack conforming to standards such as MOLLE II or other standardized military articles of luggage or garments. In some embodiments, the backpack may comprise a hard-shelled exterior.

The embodiment of laser weapon system 100 illustrated includes a control module 102, heat mitigation module 110, laser generation module 104, a power source 112, a fiber optic cable 118, and an emitting unit 114. FIG. 1 is merely one example of a platform that may be provided in embodiments of the invention and is not intended as limiting. Each of these illustrated portions will be discussed in further detail below, beginning with control module 102.

The control module 102 comprises input controls 124, a physical key port 126, a display 128, and a processor (not illustrated). The input controls 124 may comprise switches, buttons, knobs, dials, or any other physical input that may be used to adjust the functionality of laser system 100 or monitor its status via display 128. Display 128 may be provided as any kind of input and/or output screen appropriate for monitoring and/or controlling laser weapon system 100, such as a touch-sensitive LED screen, in some embodiments. In other embodiments, display 128 may be provided purely for output or may be omitted altogether. Physical key port(s) 126 may be configured to integrate with any type or number of physical keys in order to activate, arm, and/or fire the laser weapon system. In some embodiments, control module 102 may accept biometric input such as a fingerprint through display 128 or a dedicated biometric input element not illustrated, appropriate for collecting the type of biometric information being utilized. For instance, examples of other biometric input elements may include a camera or other module configured for scanning a user's eye or a microphone for recording a voice sample. In embodiments, biometric input elements may not be integrated into control module 102, but rather may be physically separated but in wired or wireless communication with the control module. Regardless of the type of biometric information collected, embodiments of the invention may compare the collected biometric information to prestored signature biometric information stored in memory to determine a successful input of an arming authorization, discussed further below.

Control module 102 may further comprise a wireless communication circuit such as an RF transmitter-receiver for enabling wireless communication with a remote location. This is not intended as limiting—structures for providing any manner of wireless communication are intended for inclusion in embodiments of the invention including those utilizing cellular phone networks, public-switched telephone networks, and satellite communications. As further described below, in embodiments the wireless communication circuit may be necessary for receiving an arming authorization signal from a remote location. Control module 102 may further comprise and/or be communicatively coupled to a timing unit, temperature sensing probe, and/or battery charge indicator.

In some embodiments, some or all of control module 102 may be provided in a hand-held and/or arm-mounted body, physically separate from the other modules of laser weapon system 100 but communicatively coupled via wired and/or wireless connection. Any protocol of wireless connection may be employed in embodiments of the invention. For example, Bluetooth, WiFi, infra-red (IR) or a proprietary wireless protocol may be used. Also included in laser weapon system 100 is a local storage module, which may be any form of computer-readable media and may be internally installed in control module 102 and/or externally and removeably attached. Computer-readable media include both volatile and nonvolatile media, removable and nonremovable media, and contemplate media readable by a database. For example, computer-readable media include (but are not limited to) RAM, ROM, EEPROM, flash memory or other memory technology, Secure Digital (SD) or Micro SD cards, CD-ROM, digital versatile discs (DVD), holographic media or other optical disc storage, magnetic cassettes, magnetic tape, magnetic disk storage, and other magnetic storage devices. These technologies can store data temporarily or permanently. However, unless explicitly specified otherwise, the term "computer-readable media" should not be construed to include physical, but transitory, forms of signal transmission such as radio broadcasts, electrical signals through a wire, or light pulses through a fiber-optic cable. Examples of stored information include computer-useable instructions, data structures, program modules, and other data representations. The laser weapon system 100 may include ports for inputting and outputting digital information, including but not limited to one or more Universal Serial Bus (USB) ports. Laser weapon system 100 may additionally include a geographic location sensing element such as a Global Positioning System (GPS) module that may be located in control module 102. Control module 102 may provide displays and/or input controls for monitoring and adjusting a power utilization mode of the laser weapon system 100, which will further be discussed below.

Heat mitigation module 110 may comprise a reservoir 105 containing a phase change material and/or may be configured to integrate with one or more removable cooling pods 108 containing a phase change material. Some embodiments may have both reservoir 105 and removable cooling pods 108, while other embodiments may have only one or the other. In embodiments, reservoir 105 may be provided as multiple reservoirs that may or may not be connected. In embodiments, a portion of the phase change material in a liquid form may be evacuated from the reservoir 105 into one or more cooling pods 108 or from a first cooling pod 108 into a second cooling pod 108. The cooling pods may be, for example, configured to integrate with a portion of the laser weapon system 100 such as the chiller forming at least a portion of heat mitigation module 110. In embodiments, the pods may be provided in a form capable of coupling with standardized military equipment. In some embodiments, heat mitigation module 110 may further comprise an emissive coating and/or structural cooling elements (e.g., cooling fins) for radiating heat away from the system. Phase change materials used in embodiments may, for example, include inorganic (e.g., salt hydrate), inorganic eutectic, and/or organic (e.g., bio-based, paraffin or carbohydrate/lipid derived), or solid/solid phase change materials. Any type of phase change material, now known or later developed is contemplated as being within the scope of the invention.

The heat mitigation module 110 may further comprise a plate-fin style heat exchanger. In embodiments, one or more types of phase change materials may be used to absorb heat received from a coolant flowing through coolant circulation system 106, causing the phase change material to at least partially melt from its solid form to liquid form. The coolant may be driven through coolant circulation system 106 via a pump 130 to receive heat from laser generation module 104. Coolant circulation system 106 and/or pump 130 may be absent in embodiments, relying rather on direct heat conduction between portions of laser generation module 104 and heat mitigation module 110. Embodiments may employ both coolant circulation system 106 with pump 130 and direct heat conduction.

Heat mitigation module 110 may be in thermal contact with a chiller for displacing heat from the phase change material and/or coolant to the surrounding environment of the laser weapon system 100. In embodiments, when the chiller is active it operates to increase the rate at which the phase change material returns from its liquid form to its solid form (freezes). In some embodiments, the chiller may merely slow the rate at which the phase change material melts from the solid form to the liquid form. As will be further discussed below, in some embodiments the chiller may not be integrated within heat mitigation module 110, but may instead be located separate from the rest of the system 100, reducing the weight to be carried by a user (or other transportation body). In other embodiments, both integrated and separate chillers may be included. In such embodiments, removable cooling pods 108 may be coupled to (or "docked" on) the remote chiller to increase the rate at which the phase change material freezes, "recharging" them for future use. The chiller in such an embodiment may be larger, faster, and/or more powerful than a chiller carried with the system in other embodiments. The result is a lighter system that resolidifies phase change material more quickly, but requires access to a remote chiller station. In embodiments, such a remote chiller station may itself be mobile, such as integrated into a vehicle or carried by another user, drone, or animal. In embodiments, the remote chiller may be configured to dock with the entire carried body 101, resolidifying the phase change material and/or recharging power source 112.

In embodiments, the heat mitigation module 110 may be operable to determine the amount of phase change material in a solid form (or, conversely, the amount of phase change material in a liquid form) and provide this information a processor of control module 102. In embodiments, the amount of phase change material sensed in a given form may be represented by a volume, mass, or weight or a fraction or percentage of the capacity of the reservoir 105. It will be appreciated that there is a known mathematical correspondence between the amount of phase change material in a solid form and the amount in a liquid form (regardless of the units used to measure), and thus for any of the embodiments described in which a remaining amount of phase change material in a given form is used by the processor of control module 102 to manage the operation of the laser weapon system 100, either of the amount of phase change material in a solid form or a liquid form is intended for inclusion, though it may not be expressly stated.

The system 100 may further comprise one or more fans 132 to facilitate heat removal from the system. Operation of fans 132 may be automatic based on sensed parameters, such as ambient or system temperatures, associated with a power utilization mode, and/or manually controlled by a user. In embodiments, any number of fans 132 may be place at any location on carried body 101.

Laser generation module 104 may comprise one or more laser pump diodes for producing the laser. Specifically, embodiments may integrate a seed laser to multiple stages of amplifying fibers, such as fiber optic cable 118, which may function as both an amplifier for the seed laser and as a coupling connection by which the amplified laser is provided to emitting unit 114. In embodiments, the amplification fibers may amplify the laser output by the seed laser in stages of 10× to 20× amplification, resulting in up to a 200× amplified laser by the point that it is output from emitting unit 114. Any or all of these components for generating and amplifying the emitted laser may produce substantial waste heat that heat mitigation module 110 must store and/or dissipate. As such, any of these components may be directly or indirectly thermally coupled to heat mitigation module 110.

As will be further discussed, emitting unit 114 may comprise at least one lens and be operable to direct the laser towards an intended target. In embodiments of the invention, the emitted laser is focused on the desired target by adjusting the distance between the output end of fiber optic cable 118 and a lens, perhaps via a knob, locking slide, and/or computer-controlled actuator. As illustrated in FIG. 1, emitting unit 114 may be configured to couple to a firearm 116, which may advantageously leverage a user's comfort, skill, and training with the firearm 116 in safely and successfully operating the laser weapon system 100. For example, firearm 116 may be a standard-issue military weapon, such as an AR-15 rifle that is coupled to the emitting unit 114 via a MIL-STD-1913 Picatinny rail system. This is not intended as limiting. In other embodiments, the firearm 116 may be mounted to emitting unit 114 via a unique physical coupling, utilizing hardware that is not reconfigurable without specialized tools. In other embodiments, emitting unit may not be coupled to a firearm 116, but rather provided as a standalone handheld unit, mounted on a user's person, clothing, or carried item, located on an autonomous or semi-autonomous vehicle such as a drone, or removably affixed to a building or other structure.

In some embodiments, the laser weapon system includes an activation mechanism operable to activate the laser generation module when actuated, firing the laser. This may, for example, be provided as a secondary trigger alongside the primary trigger for firearm 116, as a button or switch integrated into a portion of firearm 116 or emitting unit 114, provided via a handheld portion of control module 102, provided as a plunger-type switch to be held by a user and/or removably affixed the firearm 116, emitting unit 114, or the user's person (such as on a belt or shoulder strap). These examples of activation mechanisms are not intended as limiting. For example, in an embodiment, the activation mechanism may comprise a microphone coupled to and/or integrated into control until 102 that is operable to fire the weapon after detection of an authorizing command spoken by a user. In embodiments in which the emitting unit 114 is provided as a dedicated handheld unit, the activation mechanism may be a button, trigger, or other input element integrated into the device. In some embodiments, firing the laser weapon may require a voice match with an identifying voice template of the user stored in memory. In other embodiments, the laser generation module 104 may be fired remotely, based on a remote command issued from an operations center monitoring a camera, such as one worn on the user's person. Any of these envisioned activation mechanisms 120 may be partially or wholly integrated into control module 102, in embodiments.

The system 100 may further include an intensity control input, allowing a user to select one of a plurality of possible intensities of lasers to be generated by the laser generation module 104 for emission via emitting unit 114. The intensity control may be integrated into the carried body 101, coupled to a freely moving portion of control module 102, coupled or integrated to a firearm 116, or be its own freestanding module communicatively connected to the control module 102 via wired or wireless means. Examples of intensity control inputs may include knobs, buttons, switches, voice commands inputs, sliders, or any other physical or virtual (via touch screen input) controls that enable a user to vary the intensity of the generated laser beam. These examples are not intended as limiting. In embodiments, an intensity control input may allow a user direct control over the intensity of the laser or present a select number of intensities from which the user may choose. The intensity control input may be active only in the System Ready Mode 604 (discussed below) or may be available in any other mode. The intensity control may require an arming authorization be provided before enabling adjustment of the laser intensity.

For example, an intensity control may be a knob provided on the exterior of carried body 101, located on the lower side panel such that it is accessible to a user while the system (in a backpack embodiment) is being worn. The knob, in this example, may present a low intensity and high intensity laser option. The low intensity laser may be useful for system alignment, aiming or calibration. Also, a low intensity laser may be suitable for damaging "softer" targets like those made of wood, requiring less power than a high intensity laser for achieving the objective. This low intensity laser option can also be used to provide heating of a surface of a target to allow "tagging" such that the target can be better tracked using thermal camera systems. When another objective, perhaps made of steel, requires a high intensity laser, the intensity control knob may be adjusted to the cause the laser generation module 104 to produce a stronger laser, using more power by providing a higher damage output.

Power source 112 may supply all or a portion of the power needed for each of the control module 102, heat mitigation module 110, and laser generation module 104. In some embodiments, power source 112 may comprise one or more removable batteries, such as lithium ion batteries. This is not intended as limiting. In embodiments, any suitable power source may be utilized and/or the power source may be permanently integrated into the laser weapon system 100. The power source 112 may be charged via corded coupling with an external power source and/or temporary docking with a remote battery charger, such as a generator or a companion recharging dock integrated into a vehicle. In embodiments, the power source 112 may be physically and/or operably disconnected from a portion or all of the other components of system 100 until the system is being prepared to fire. Again, these systems and methods of recharging are not intended to be limiting.

Further illustrated in FIG. 1 is sighting scope 122, which may be coupled to firearm 116 or emitting unit 114 in embodiments of the invention. In other embodiments, the sighting scope 122 may be provided in a freely movable self-contained handheld unit and/or coupled to the user's person. Sighting scope 122 may be dedicated to operation of the laser weapon or may be additionally used for targeting the primary projectile firing operation of firearm 116. Particularly, since embodiments of the laser weapon system 100 may produce an infrared laser that is invisible to a human eye, sighting scope 122 may be provided to allow a user to see the point and/or object being impacted by the emitted laser. For instance, sighting scope 122 may be a day/night sighting scope, capable of representing light reflected from the incident point in a visible form to the user's eye. Alternatively, sighting scope 122 may be a thermal scope, allowing the user to see a temperature increase caused by the incident laser. In either embodiment, sighting scope 122 allows the user to verify that the emitted laser is impacting the intended target, adjusting the direction and/or focusing of the emitting unit 114 accordingly if it is not.

In certain embodiments, laser weapon system may include an inclinometer 134, which may be integrated into emitting unit 114, sighting scope 122, or elsewhere on the laser weapon system or user's person. Inclinometer 134 may be utilized in embodiments of the invention to prevent and/or cease generation of a laser via laser generation module 104 when the sensed angle of inclinometer indicates that the emitted laser is or is likely to project into outer space. In some embodiments, detection of an inclination past a threshold inclination and/or above a determined horizon may initiate a warning and/or may cause initiation of a timer that, upon expiration, prevents and/or ceases generation of a laser via laser generation module 104. In embodiments, the warning and/or timer may be cancelled or overridden by a manual input by a user to control module 102 and/or from activation mechanism 120 and/or a received remote signal. In embodiments, the processor of the system 100 is configured to automatically cease generation of the laser by the laser generation module when the inclinometer determines that the emitting unit is directed above a threshold angle.

Any of the above elements, modules, controls, or units illustrated or discussed may be structurally, electrically, and/or communicatively connected using structures or wires not expressly illustrated or described. For example, in embodiments, a wire may run from control module 102 to activation mechanism 120 and/or inclinometer 134.

Figure 2A:
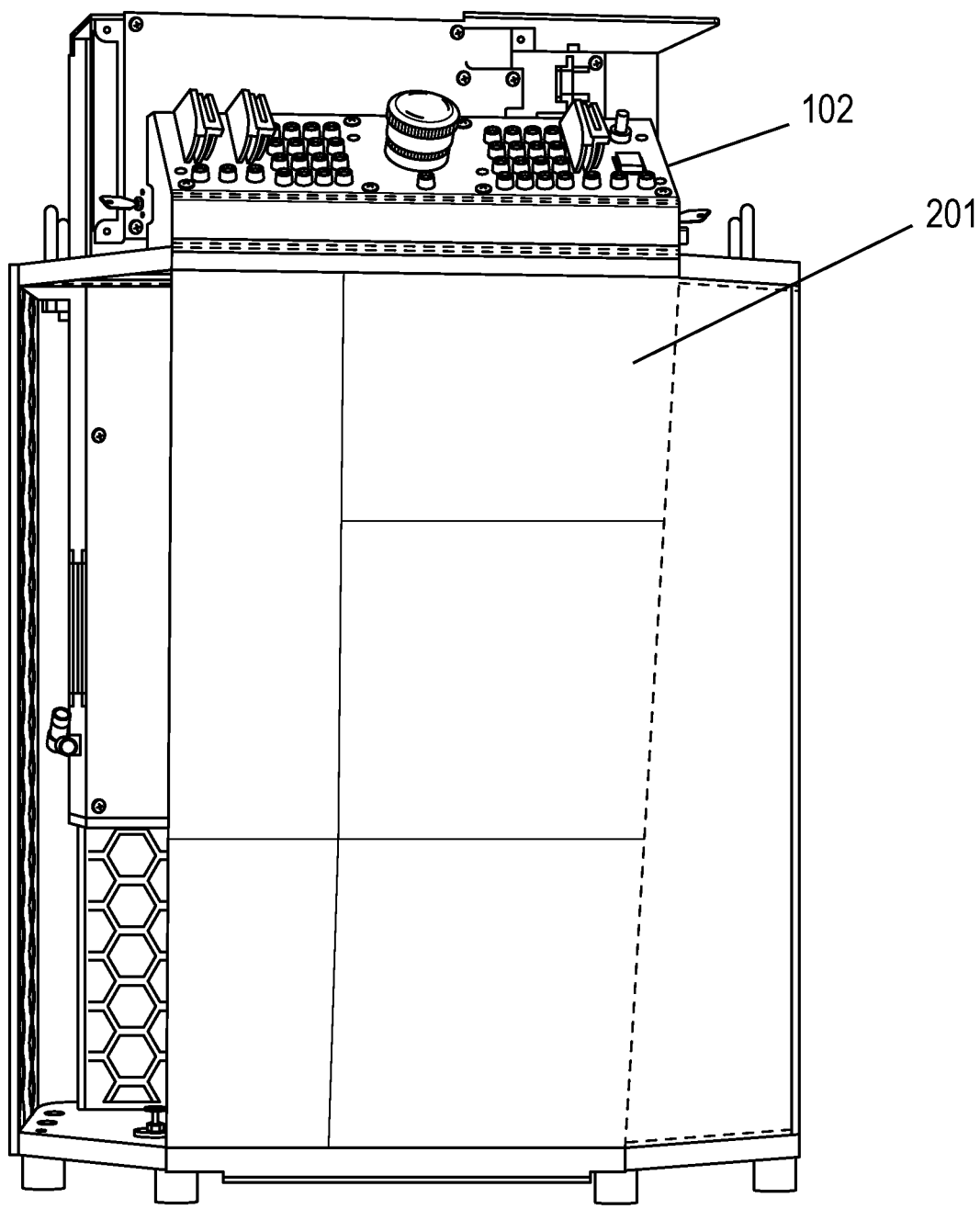
FIGS. 2A-2C depict embodiments of a carried body in a single housing containing the control, laser generation, and heat mitigation modules.
Figure 2B:
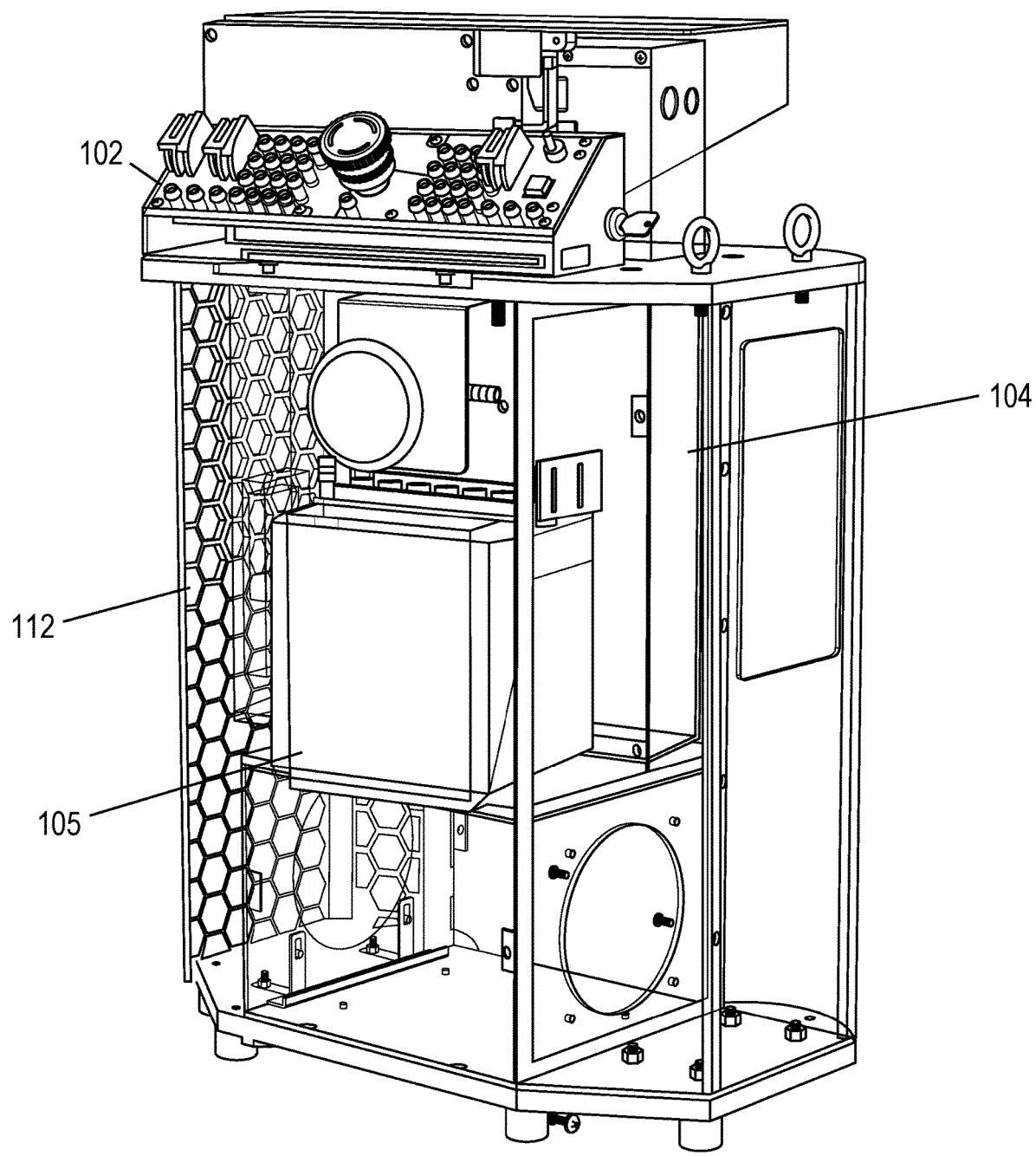

FIGS. 2A and 2B depict embodiments of carried body 101 contained within a single housing 201 configured to provide a convenient unit for transport by a user. In embodiments, the carried body 101 may comprise all of the modules 102, 104, 110 illustrated and described. In other embodiments, modules or other elements illustrated in FIGS. 2A and 2B may be carried separate from housing 201 or may not be carried at all, for example in the case of a remote chiller discussed previously. In embodiments, a portion of housing 201 may be provided by a structural portion of control module 102, laser generation module 104, heat mitigation module 110, and/or power source 112. For example, a portion of housing 201 may be formed by the outer casing of a battery comprising power source 112.

Figure 2C:
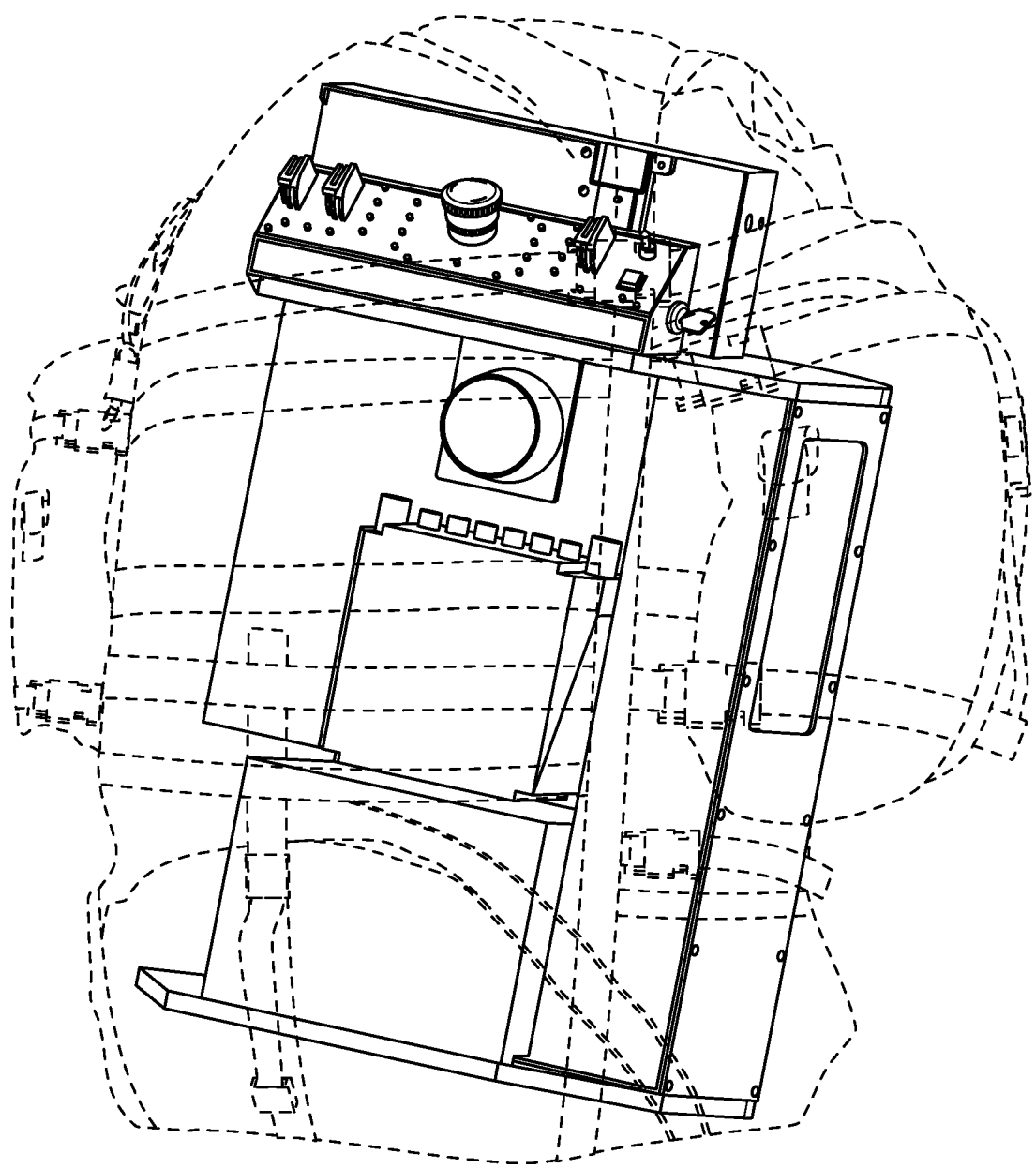

FIG. 2C depicts an embodiment of the unit illustrated in FIGS. 2A and 2B within an encompassing backpack to enable a user to carry the unit. The backpack may, in embodiments, be a standard issue military backpack or may be specially configured for transporting the carried body 101. Of course, this is not intended as limiting. Embodiments of carried body 101 may be provided in any shape and/or within any encompassing structure convenient for transportation by one or more users, animals, and/or traditional, autonomous, or semi-autonomous vehicles, including drones. For example, all or a portion of carried body 101 may be borne by a semi-autonomous terrestrial drone, configured to determine its own path while staying within a threshold distance of a user carrying emitting unit 114. In embodiments, this may be achieved through detection by the drone of a short-range wireless signal transmitted from the user's person and/or optical tracking of the user by the drone. Additionally or alternatively, a semi-autonomous vehicle may travel along a predetermined path and/or to a programmed destination, but may substantially match the pace of a user. These are merely examples of how a drone may operate semi-autonomously and are not intended as limiting.

Figure 3:
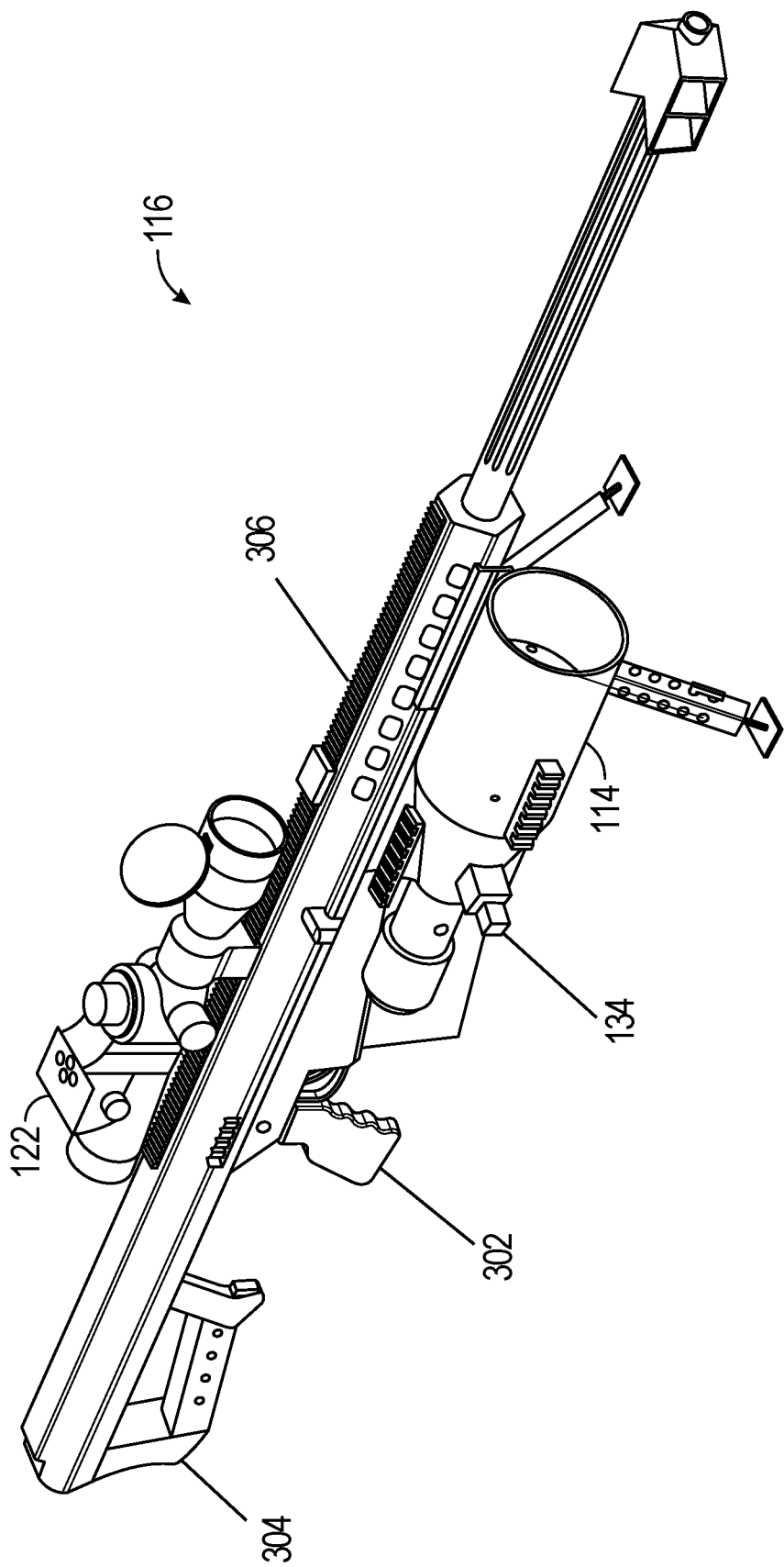
FIG. 3 depicts an embodiment of an emitting unit coupled to a firearm.

FIG. 3 depicts an embodiment of emitting unit 114 and sighting scope 122 coupled to a firearm 116. As illustrated, the emitting unit 114 is coupled to a rail coupling system, positioned to the side of the firearm to allow use of sighting scope 122 for gross targeting. In embodiments, activation mechanism 120 may be provided on or near emitting unit 114, on or near the trigger of firearm 116, provided separately as a button, switch, or plunger, or located on the grip 302, stock 304, hand guard 306, or foregrip (not illustrated) of firearm 116 such that the user may activate the laser generation module 104 without removing their hands from a natural position for operating the firearm. In embodiments, the laser generated by the system 100 may be fired using the firearm's traditional trigger, via selection of a laser weapon option on a fire selector switch. As such, normal operation of the firearm 116 may be disabled during laser selection or operation in embodiments of the invention, perhaps through implementation of a safety interlock. In an embodiment, fiber optic cable 118 may decouple from the emitting unit 114, allowing the unit to remain coupled to the firearm 116 when the carried body 101 is distant from the firearm. This may be desirable while transporting the system 100 because prior focusing and/or sighting performed for the positioning of the emitting unit 114 on the firearm 116 is maintained. Embodiments may include mechanisms allowing for quick connection and disconnection of the fiber optic cable 118 to the emitting unit 114 and/or stowage of the fiber optic cable 118 on or within the housing 201 of carried body 101. For example, when disconnected, fiber optic cable may automatically wind up in or on housing 201 using mechanical and/or electrical motivation.

The firearm mounting illustrated in FIG. 3 is intended only as exemplary and is not limiting. In embodiments, the emitting unit may removably and/or permanently couple to a structure, vehicle (including traditional vehicles, autonomous vehicles, or semi-autonomous vehicles), user's person, or dedicated carried body. For example, emitting unit 114 may mount to the shoulder or headwear of a person, or may couple or be integrated into a carried framework, such as a body resembling a traditional firearm but lacking the mechanisms required for traditional ammunition firing, or may be affixed to a portable detachable structure such as a tripod.

Figure 4:
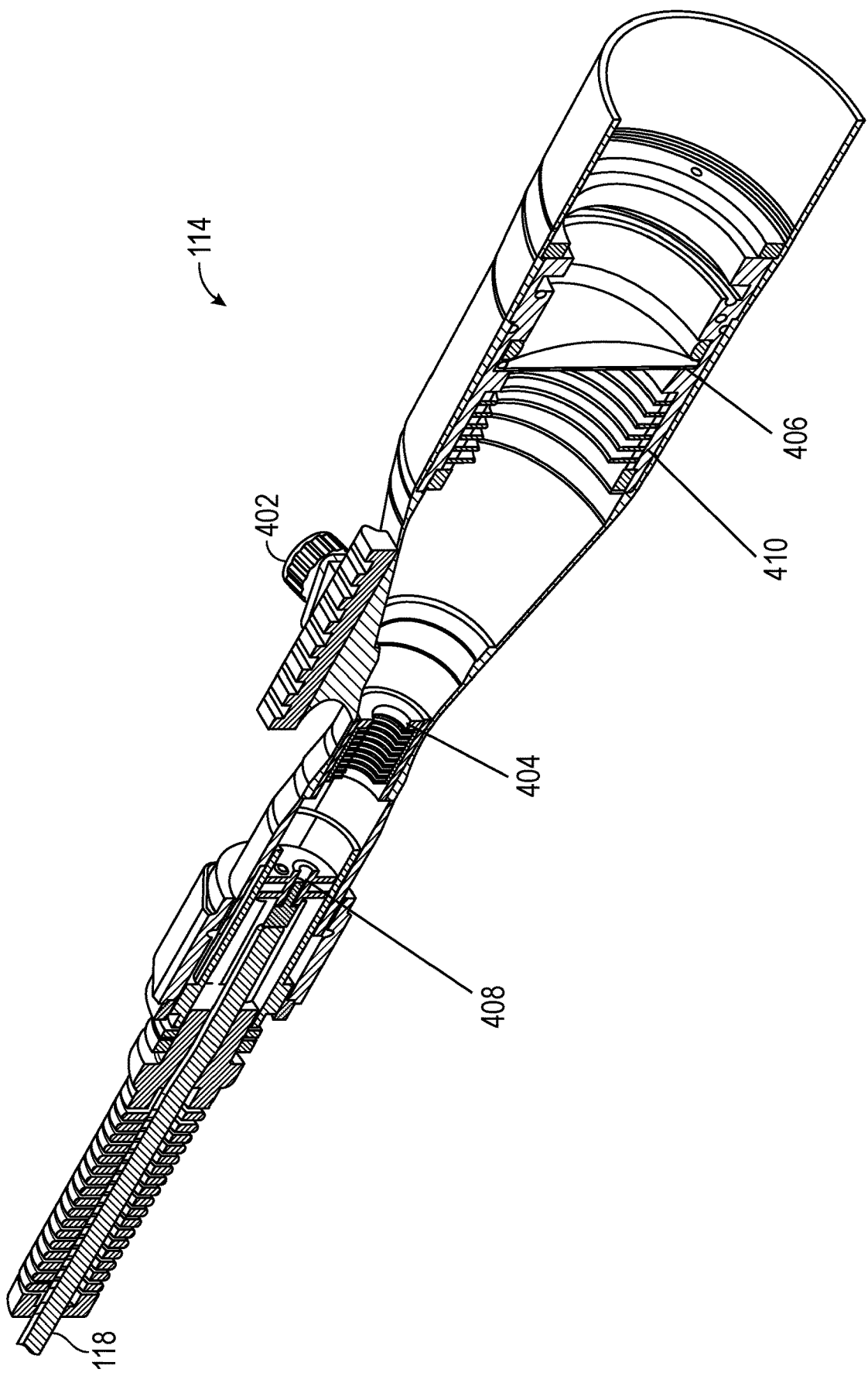
FIG. 4 depicts a cross-sectional view of an embodiment of an emitting unit.

A cross-sectional view of an exemplary embodiment of emitting unit 114 is illustrated in FIG. 4, coupled to fiber optic cable 118 to receive the generated laser from cable terminus 408. A focusing knob 402 is provided that is operable, in embodiments, to adjust the distance between cable terminus 408 and first lens 404. The simple two lens optical design of the telescope of illustrated in FIG. 4 allows the laser emitted via second lens 406 to be focused in the far field, without the need for a dedicated element to receive, focus, and collimate the laser. However, this is not intended as limiting. Alternative constructions of emitting unit 114 comprising any number of lenses and other structures for focusing the emitted laser including dedicated focusing lenses are intended for inclusion in embodiments of the invention. In some embodiments, emitting unit 114 may comprise baffling 410 to reduce stray light emissions. In some embodiments, emitting unit 114 may be operable to produce and emit a visible laser light for focusing the laser weapon prior to or while firing the high power laser.

Figure 5A:
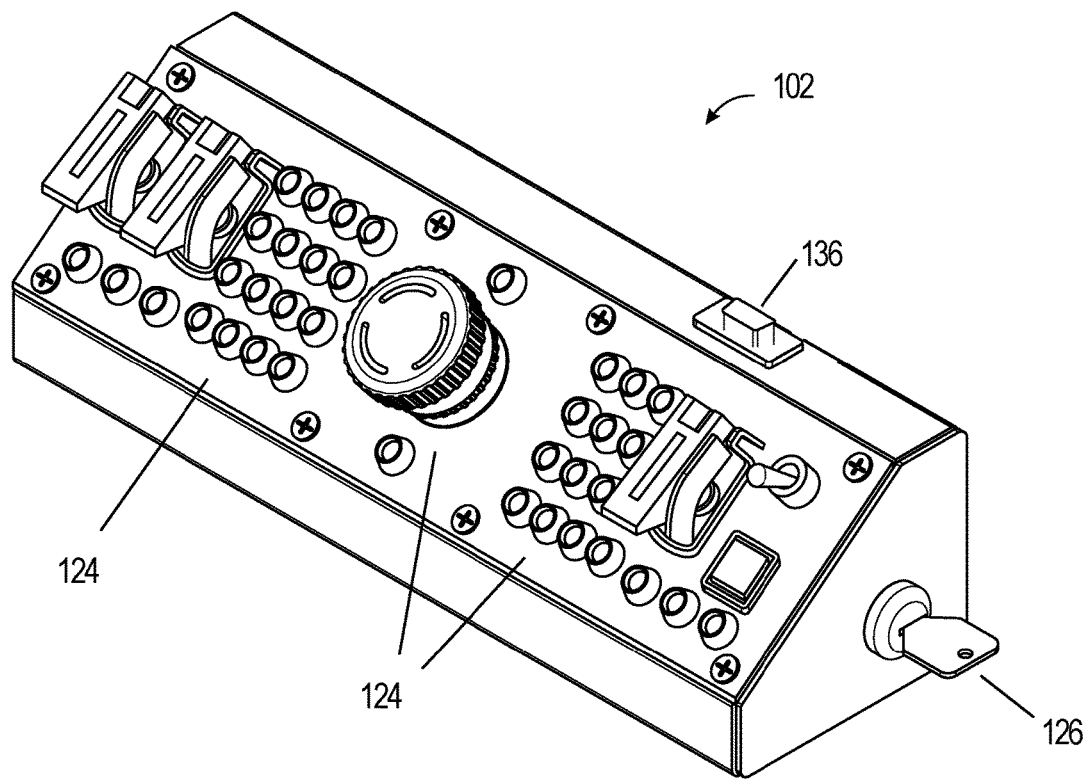
FIG. 5A depicts a portion of a control module embodied as an integrated portion of a carried body.
Figure 5B:
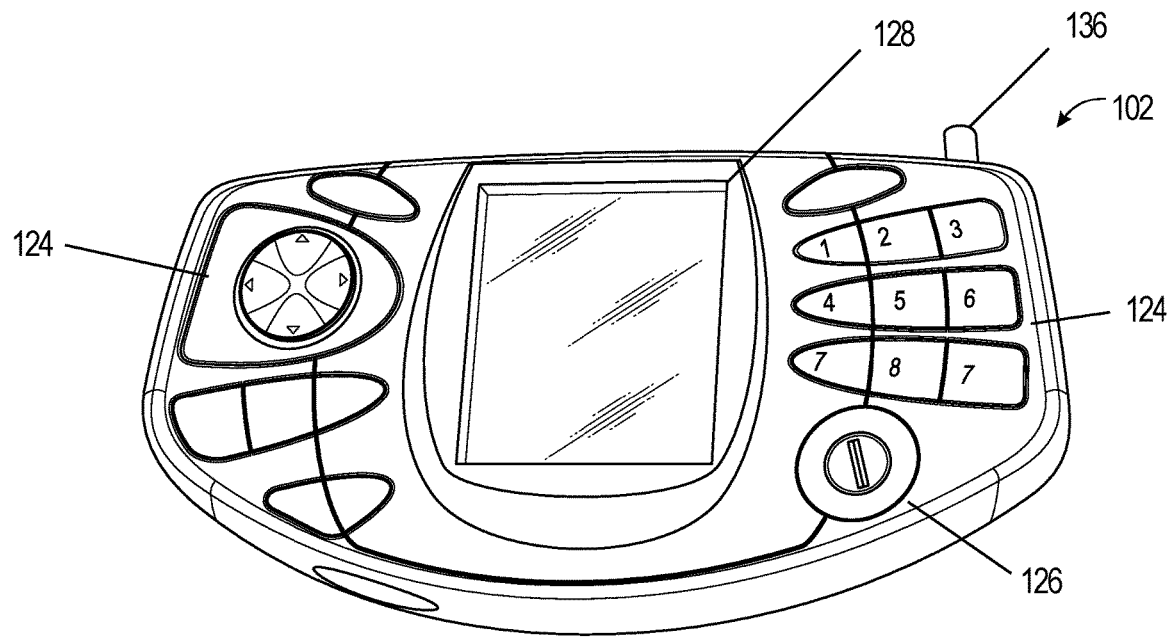
FIG. 5B depicts an embodiment of a portion of a control module configured as a freely moving device.

In embodiments, control module 102 may be segmented into two parts: a first part that may move freely and a second part forming a portion integral to carried body 101. These two portions are communicatively coupled via wired or wireless connection to perform the functions described in this specification for control module 102 that may be more convenient to a user bearing the system. Illustrated in FIG. 5A is an exemplary portion of control module integral to the carried body 101, while FIG. 5B is an embodiment of the freely-moving portion, constructed as a handheld device similar to a rugged smartphone or tablet computer. The embodiments illustrated are not meant to be limiting, but merely exemplary of how a portion control module 102 may be constructed. In embodiments, multiple freely moving portions of control module 102 may be provided, which may be affixed to a user's person, such as by an arm or wrist strap.

Each of the portions of control module 102 illustrated in FIGS. 5A and 5B may include input controls 124, physical key port 126, and/or antenna 136, which may be provided as an internal antenna, in embodiments. Embodiments may additionally or alternatively include a heads-up display (HUD) provided on a portion of headwear such as goggles, glasses, facemask, and/or a transparent component of a helmet. Embodiments may communicatively connect portions of the control module 102 via wired and/or wireless connections, or may only provide a single, integrated portion. Embodiments may provide the integrated portion as an internal component of the carried body 101 only, not visible to the user, requiring input via one or more freely moving portions. That is, the integrated portion of control module 102 may be invisible to a user, providing no visible input controls or outputs, but rather providing all output and receiving all input from a remote location and/or a freely moving portion of the control module, such as the wireless embodiment of FIG. 5B.

Whether integrated into the carried body or freely moving, a portion of the control module 102 may comprise a display 128 for outputting and inputting information to and from a user. For example, the display 128 may display a remaining power level of the system and/or a temperature reading of at least a portion of the system. Specifically, in an embodiment, an output screen, such as an input/output touch screen display 128 may be affixed to a user's arm or provided on an ocular display to provide an updated report on the temperature, charge, remaining phase change material level, laser intensity level, and/or current power utilization mode of the system.

Operation of Embodiments of the Invention

Figure 6:
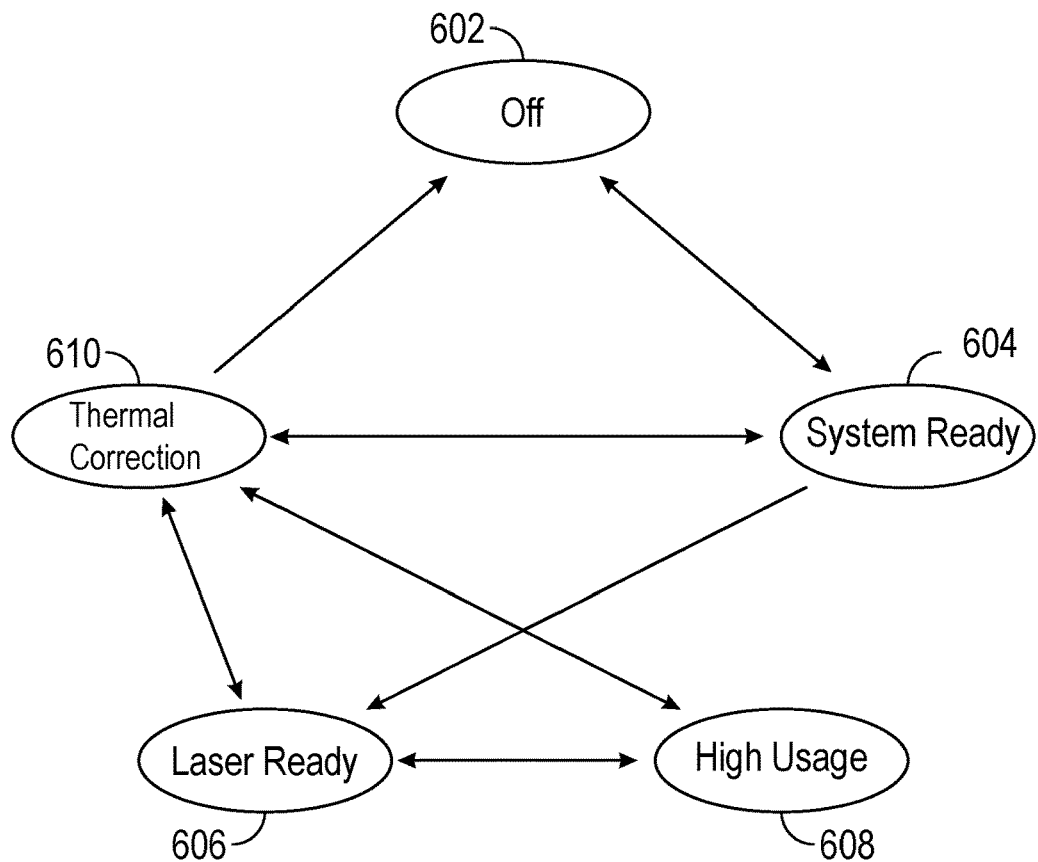
FIG. 6 depicts a conceptual diagram of power utilization modes that may be employed in embodiments of the invention.

FIG. 6 presents a conceptual diagram of power utilization modes that may be established and maintained in embodiments of the invention. These modes may be initialized once the system is provided with power, such as by batteries or other external power. In embodiments, some of the modes illustrated and described herein may be unused or unavailable, while in other embodiments power utilization modes not described may be employed. The arrows presented in FIG. 6 represent transitions between power utilization modes that may be implemented by the processor of the control module 102 in embodiments, though the arrows are not exhaustive of all power utilization mode transitions envisioned.

In Off Mode 602, the control module 102, heat mitigation module 110, and laser generation module 104 of laser weapon system 100 are completely dormant, consuming little to no power from power source 112 and generating little to no waste heat. In embodiments, local housekeeping functions such as local fans 132 may be powered while in Off Mode 602, drawing minimal power. In some embodiments, the power source 112 may be physically and/or operably disconnected from a portion or all of the other components of system 100 while the system is in Off Mode 602. In embodiments, connecting or inserting a power source 112, such as a removable battery, may cause the system to transition to another mode, such as System Ready Mode 604.

From Off Mode 602, the laser weapon system 100 may transition to System Ready Mode 604 in which the processor of control module 102 becomes at least partially operational, consuming low amounts of power from power source 112. In embodiments, heat mitigation module 110 and/or laser generation module 104 may become at least partially operational while the processor is maintaining System Ready Mode 604, but the laser generation module 104 does not produce the high power laser to be emitted and the chiller of heat mitigation module 110 is inactive, thus conserving power. In embodiments, pump 130 and/or fan 132 may be operational while System Ready Mode 604 is maintained by the processor of control module 102 at a lower operating speed or power than in Laser Ready Mode 606, High Usage Mode 608, and/or Thermal Correction Mode 610 described below.

From System Ready Mode 604, the processor of control module 102 may be operable in embodiments to transition the laser weapon system 100 into either of a Laser Ready Mode 606 or a High Usage Mode 608. In embodiments, this may be in response to a user's manual input and/or remotely initiated. In embodiments, transitioning to Laser Ready Mode 606, High Usage Mode 608, or any other mode may additionally require an arming authorization input to be received by the processor or a secondary processor, as further discussed below. Additionally, the processor may transition the laser weapon system 100 from System Ready Mode 604 to Off Mode 602 based on a user's manual input, a remote signal, expiration of a timer, a sensed level of phase change material in a liquid or solid form, sensed available power levels of power source 112 falling below a threshold charge level, and/or a temperature surpassing a threshold temperature level.

While the laser weapon system is maintained in Laser Ready Mode 606, the laser generation module 104 is active, generating a seed laser that may be amplified to a laser beam and directed towards a target via emitting unit 114. However, in order to minimize the overall laser weapons system's power consumption (enabling use of a smaller, lighter weight power source 112), the chiller of system 100 is held inactive while in Laser Ready Mode 606. In particular embodiments, pump 130 driving coolant circulation system 106 and/or fan(s) 132 may be active or inactive while in Laser Ready Mode 606. Specifically, four different submodes of Laser Ready Mode 606 may be available in embodiments, each of which may be selectable by a user, remote signal, and/or processor of the control module 102 in embodiments of the invention to carefully control the balance of power usage versus rate at which the system dissipates heat. In Laser Ready Submode I, each of the pump 130 and fans 132 are off. In Laser Generation Ready II, the pump 130 is on and the fans 132 are off. In Laser Ready Submode III, the pump 130 is off and the fans 132 are on. In Laser Ready Submode IV, each of the pump 130 and fans 132 are on. Further submodes may be available controlling how many of the available fans are operational.

In embodiments, the processor of control module 102 may transition the laser weapon system 100 from Laser Ready Mode 606 to another mode based on a user's manual input, a remote signal, expiration of a timer, sensed available power levels of power source 112 falling below a threshold charge level, a sensed remaining amount of phase change material in a solid form or a liquid form, and/or a temperature surpassing a threshold temperature level. Particularly, in embodiments, the laser weapon system 100 may be restricted from transitioning directly from Laser Ready Mode 606 to Off Mode 602 by the processor of control module 102, as such a transition may prevent heat from being properly expelled. Further, in embodiments, the laser weapon system 100 may automatically transition from Laser Ready Mode 606 to either of System Ready Mode 604 or Thermal Correction Mode 610 (discussed below) when a sensed remaining charge level of power source 112 falls below a predetermined threshold stored in memory, a remaining amount of phase change material in a solid form drops below a predetermined fraction, mass, or volume, and/or the temperature of laser generation module 104 exceeds a predetermined temperature threshold stored in memory. In embodiments, the laser weapon system 100 may warn the user that such an automatic transition is about to occur, allowing the user to initiate a transition manually or override the transition via a manual input to control module 102.

While the laser weapon system is maintained in Thermal Correction Mode 610 by the processor of control module 102, the laser generation module 104 is inactive and a chiller is active in order to dissipate unwanted heat or a heater is active in order to bring the system up to an optimal operational temperature range (such as for use in cold environments). It is envisioned that the laser weapon system 100, in embodiments, may alternate between Laser Ready Mode 606 and Thermal Correction Mode 610, resulting in a trade-off in operational uptime between laser generation module 104 and chiller. By operating only one of these subsystems at a given time, the total power consumption and peak power consumption of the system are reduced, allowing the laser weapon system to utilize a power source 112 that is smaller and/or lighter than would otherwise be needed. In embodiments, the laser weapon system may alternate between Laser Ready Mode 606 and Thermal Correction Mode 610 automatically based on a temperature, time, or charge threshold and/or a fraction of phase change material remaining in a solid form or a fraction of phase change material remaining in a liquid form. That is, when a sensed temperature of the system 100 surpasses a predetermined temperature threshold, the processor of control module 102 may automatically transition embodiments of the system 100 from Laser Ready Mode 606 to Thermal Correction Mode 610. In the same or other embodiments, when a sensed temperature of the system 100 drops below (or rises above) a predetermined temperature threshold, the processor of control module 102 may thereafter allow a transition of the system 100 from Thermal Correction Mode 610 to Laser Ready Mode 606 or High Usage Mode 608. In embodiments, this transition from Thermal Correction Mode 610 to either of Laser Ready Mode 606 or High Usage Mode 608 may be allowed only when a sensed fraction of the system's phase change material transitions to a solid form.

Similarly, when a sensed remaining charge level of power source 112 drops below a predetermined charge threshold, the processor of control module 102 may automatically transition the system from Laser Ready Mode 606 to Thermal Correction Mode 610. In some embodiments, the processor may prevent the system from entering Laser Ready Mode or High Usage Mode unless the remaining charge level of power source 112 is above a predetermined charge threshold. In some embodiments, the power source 112 may be partially or wholly rechargeable and/or replaceable while the laser weapon system is in any power utilization mode. Thus, if due to charging or replacing of batteries the sensed remaining charge level surpasses a predetermined threshold, transitioning the system from either of Thermal Correction Mode 610 or System Ready Mode 604 to either of Laser Ready Mode 606 or High Usage Mode 608 may be enabled.

In some embodiments, transitioning between Laser Ready Mode 606 and Thermal Correction Mode 610 may be governed by one or more predetermined lengths of time. Upon entering Laser Ready Mode 606, for instance, a timer may begin incrementing or decrementing. Upon expiration of a first predetermined length of time, the processor of control module 102 may automatically transition the system 100 from Laser Ready Mode 606 to Thermal Correction Mode 610. In the same or other embodiments, upon expiration of a second predetermined length of time initiated upon transition to Thermal Correction Mode 610, the processor of control module 102 may allow transitioning the system 100 from Thermal Correction Mode 610 to Laser Ready Mode 606 or High Usage Mode 608. In embodiments, the first length of time may be the same or distinct from the second length of time. In other embodiments, the same behavior may be enforced by the processor of control module 102 wherein one or more of the timers are determined by the processor during operation of the laser weapon system 100 rather than being predetermined.

In some embodiments, the processor of control module 102 may automatically or manually transition the system directly from System Ready Mode 604 to Thermal Correction Mode 610 to maintain the system within an optimal operational temperature range. While Thermal Correction Mode 610 is critical for expelling waste heat generated by the system (particularly laser generation module 104), Thermal Correction Mode 610 is also utilized in embodiments to account for other undesirable temperature changes, such as those due to the ambient environment. For example, when being used in a high-temperature environment such as a desert, Thermal Correction Mode 610 may be manually or automatically entered (such as, based on a sensed internal and/or ambient temperature) to lower the system's temperature and/or wholly or partially return the phase change material to a solid state. Similarly, in embodiments, the system may include one or more internal heaters for raising the system to an optimal temperature range when the ambient temperature becomes undesirably low.

When the processor of control module 102 transitions the laser weapon system 100 to High Usage Mode 608, each of laser generation module 104 and chiller are made active. Employing High Usage Mode enables a laser to be fired from emitting unit 114 for a longer period of time; perhaps until a sensed temperature of a portion of the system 100 exceeds a threshold temperature, a sensed fraction of the system's phase change material transitions to a liquid form, and/or a remaining charge of power source 112 drops below a threshold charge level. Since both the laser generation module and chiller are simultaneously active, High Usage mode may exhaust power source 112 quickly and/or require the system to transition to Thermal Correction Mode 610 for a long time upon exiting High Usage Mode 608 to expel the possibly large amount of heat generated. As such, in embodiments, the processor of control module 102 may require an additional remote authorization and/or particular manual user input to transition the system 100 to High Usage Mode 608 from any of System Ready Mode 604, Laser Ready Mode 606, or Thermal Correction Mode 610. In embodiments, each of the methods described above for transitioning the system 100 between Laser Ready Mode 606 and Thermal Correction Mode 610 based on a remaining charge, temperature, timer, and/or remaining amount of phase change material in a solid form may further be similarly employed for transitioning the system from High Usage Mode 608 to another power utilization mode and vice versa. Specifically, the processor of control module 102 may automatically transition the system 100 from High Usage Mode 608 to Thermal Correction Mode 610 or Laser Ready Mode 606 when a sensed temperature exceeds or falls below a predetermined threshold, a remaining charge level or remaining amount of solid phase change material falls below a predetermined threshold, and/or a timer expires. Similarly, the processor may only allow the system 100 to enter High Usage Mode 608 when a sensed temperature is below a predetermined threshold, a remaining charge level or remaining amount of solid phase change material is above a predetermined threshold, and/or a timer expires. Again, in embodiments, any or all of these thresholds and timers may be determined during operation rather than being predetermined. Additionally, the processor of control module 102 may transition the system 100 from High Usage Mode 608 to Thermal Correction Mode 610 or Laser Ready Mode 606 based on a user's manual selection.

In some embodiments, the processor of control module 102 may prevent the system from performing a transition between particular power utilization modes illustrated in FIG. 6. For example, the laser weapon system may be restricted by the processor from transitioning directly from either of Laser Ready Mode 606 and/or High Usage Mode 608 directly to Off Mode 602 without first entering and maintaining Thermal Correction Mode 610. In some embodiments, the system may only transition to Off Mode 602 or System Ready Mode 604 when the temperature of the system 100 and/or the amount of phase change material in a liquid form is below a predetermined threshold. In other embodiments, the processor may prevent the system 100 from ever transitioning directly from High Usage Mode to System Ready Mode 604 or Laser Ready Mode 606 or vice versa. This list is intended as neither limiting nor exhaustive. In other embodiments, any the system may directly transition between any two power utilization modes illustrated or discussed.

In embodiments, transitions between any two of the modes described with regards to FIG. 6 by the processor of control module 102 may require an authorization input to be received by the processor or a secondary processor before the previously-implemented mode is ceased, and the desired mode is implemented. The authorization input may come from a user's manual input to the control module 102 and/or from a received remote signal. This includes Off Mode 602. Modes not illustrated may be possible and/or modes illustrated may be omitted in embodiments. Specifically, embodiments of the invention may not allow High Usage Mode 608 to be established by the processor of control module 102 because of limitations on available peak power usage.

Figure 7:
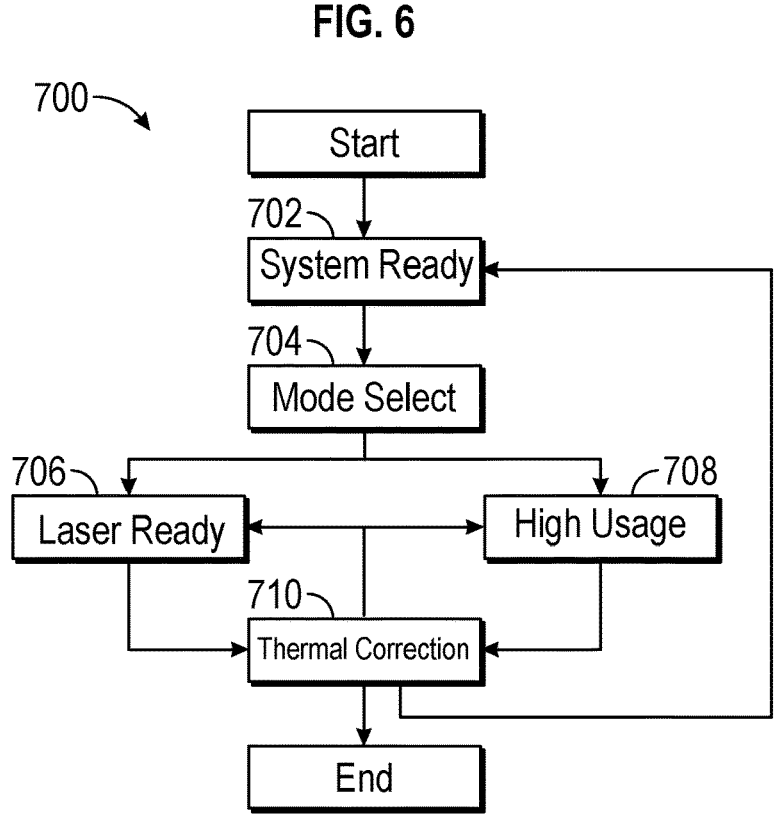
FIG. 7 depicts a first flowchart illustrating the operation of a method in accordance with an embodiment of the invention.

Illustrated in FIG. 7 is a method that may be stored in computer-executable instructions on a non-transitory computer readable medium of the system according to an embodiment of the invention beginning at step 702, in which a laser weapon system is initially in Off Mode 602. The method illustrated in FIG. 7 is only one example of how an embodiment of the system may operate and is not intended as limiting. Specifically, transitions between power utilization modes not expressly illustrated in FIG. 7 but described elsewhere in this specification and/or illustrated in figures are intended for inclusion within embodiments of the invention.

Upon user input to control module 102 and/or a signal received from a remote location, the system 100 boots up into System Ready Mode 604 in step 702. System Ready Mode 604 may be used for purposes of testing, calibrating, aiming, passively cooling, and/or initiating operations of the system 100 without consuming considerable power or excessively generating heat, as may happen if these purposes were carried out in other modes. In embodiments, the transition from Off Mode 602 to System Ready Mode 604 may require an arming authorization to be provided to the processor of control module 102, which may be provided directly to input elements of the control module or elsewhere on the system 100 or may be provided at a remote location and transmitted to the system. Examples of arming authorizations may include one or more physical keys, such as a traditional key cut from metal, input of a fingerprint, a voice command, or other biometric input, and/or entry of a passcode. In embodiments, power utilization mode transitions that result in arming the system 100 may additionally or alternatively require other detected parameters, such as proximity to a sensed location (including being within geographical boundaries), an acceptable elevation or inclination of emitting unit 114, or established electronic communication with a distinct electronic device or network.

At step 704, a user or remote operator of the system 100 selects one of a plurality of other modes to be implemented by the processor of control module 102. Modes may be selected via, for example, an input element such as a button, knob, or touch screen display, which may be coupled to or integrated into a firearm 116 in embodiments. Particularly, a user may be presented with options for selecting from Laser Ready Mode 606, in which the laser generation module 104 is active but the chiller (or heater) is dormant, or High Usage Mode 608 in which both the laser generation module 104 and chiller are active, increasing the length of time the laser is fired but quickly consuming power. As with the transition from Off Mode 602 to System Ready Mode 604 described above, transition from System Ready Mode 604 to either of Laser Ready Mode 606 or High Usage Mode 608 may require one or more arming authorizations, which may in embodiments be the same or distinct from those required in transition from Off Mode to System Ready Mode. In a particular embodiment, transition from System Ready Mode 602 to Laser Ready Mode 604 may be enabled by a first or second arming authorization, while transition to High Usage Mode 608 may require specifically the second arming authorization, indicating a higher authority level.

If Laser Ready Mode 606 is selected in step 704, the method progresses to step 706 in which the processor of the system activates the laser generation module 104, enabling a laser beam to be emitted from emitting unit 114 when an activation mechanism 120 is actuated without activating the chiller of system 100. In some embodiments, fan(s) 132 and/or pump(s) 130 may be operational while in Laser Ready Mode 606, while in others the fans and pumps may be inactive. In embodiments, selective operation of fans and/or pumps may be manual by a user, controlled by the processor of control module 102, or provided as distinct power utilization modes. Specifically, Laser Ready Mode 606 may comprise four selectable submodes corresponding to (I) the pumps and fans being inactive, (II) the pumps being active and the fans being inactive, (III) the pumps being inactive and the fans being active, and (IV) the pumps and fans being active. Laser Ready Mode 606 may also be called "Firing Mode."

If High Usage Mode 608 is selected in step 704, the processor of the system activates both the laser generation module 104 and the chiller of system 100, maximizing the time a laser beam may be emitted from emitting unit 114 (upon actuation of activation mechanism 120) by simultaneously actively expelling waste heat but at a cost of requiring a high power output. In some embodiments, entering High Usage Mode may require a specific, higher-level arming authorization than entering other modes, and/or may require a specific signal received from a remote location. Additionally or alternatively, entering or preparing to enter High Usage Mode at step 708 may trigger an audible and/or visible alert that High Usage Mode consumes power quickly and may significantly reduce the longevity of the current power source 112. In some embodiments, this alert may need to be acknowledged before the system 100 enters High Usage Mode 608. In embodiments, the processor of control module 102 may transition the system 100 between Laser Ready Mode and High Usage Mode as needed, based on a user's manual selection, a remote signal, and/or automatically based on a sensed temperature of a portion of the system.

Similarly, the processor of control module 102 may transition the system 100 from either of Laser Ready Mode or High Usage Mode to Thermal Correction Mode at step 710 based on a user's manual selection, expiration of a timer, a remote signal, and/or automatically based on a sensed temperature of a portion of the system or charge remaining in power source 112. In some embodiments, the processor may prevent the system from entering System Ready Mode 604 and/or Off Mode 602 without first reducing the temperature of at least a portion of the system below a threshold, perhaps via Thermal Correction Mode 610. Embodiments are envisioned in which the system reverts from Thermal Correction Mode 610 to either of Laser Ready Mode or High Usage Mode as well.

In embodiments, any or all of the power utilization mode transitions discussed above may wholly or partially be controlled by artificial intelligence (AI) performed by the processor of control module 102. For example, the operational uptime of the laser and/or longevity of the power source 112 may be maximized by AI based on, for instance, a sensed ambient temperature of the environment in which the system 100 is being operated.

Many different arrangements of the various components depicted, as well as components not shown, are possible without departing from the scope of the claims below. Embodiments of the invention have been described with the intent to be illustrative rather than restrictive. Alternative embodiments will become apparent to readers of this disclosure after and because of reading it. Alternative means of implementing the aforementioned can be completed without departing from the scope of the claims below. Certain features and subcombinations are of utility and may be employed without reference to other features and subcombinations and are contemplated within the scope of the claims. Although the invention has been described with reference to the embodiments illustrated in the attached drawing figures, it is noted that equivalents may be employed and substitutions made herein without departing from the scope of the invention as recited in the claims. For example, though a chiller is disclosed for reducing waste heat in a high-temperature environment, embodiments may further comprise a heater for operation in an undesirably cold environment. In embodiments, a chiller and/or heater are used when needed to bring the system into an operable temperature range, which is typically dependent upon environmental conditions.

Having thus described various embodiments of the invention, what is claimed as new and desired to be protected by Letters Patent includes the following:

1. A mobile laser weapon system comprising:
    a laser generation module comprising a laser pump diode operable to generate a laser;
    a fiber optic cable configured to be coupled to the laser generation module;
    an emitting unit configured to be coupled to the fiber optic cable and operable to direct the laser towards a target;
    a chiller operable to increase a rate at which a phase change material converts from a liquid form to a solid form;
    a heat mitigation module comprising a coolant that receives heat from the laser generation module,
    wherein the heat received from the laser generation module at least partially converts the phase change material from the solid form to the liquid form;
    an inclinometer; and
    a processor communicatively coupled to the inclinometer,
    wherein the processor is configured to automatically cease generation of the laser by the laser generation module when the inclinometer determines that the emitting unit is directed above a threshold angle,
    wherein a first portion of the laser weapon system is configured to be carried by a first person.

2. The system of claim 1, wherein a second portion of system is configured to be carried by a second person.

3. The system of claim 1, wherein a second portion of the system is configured to be carried by a vehicle that is at least semi-autonomous.

4. The system of claim 1, further comprising a control module configured to display a power level of the system and a temperature reading of the system.

5. The system of claim 1,
    wherein the emitting unit comprises a lens, and
    wherein the laser is focused by adjusting a distance between the fiber optic cable and the lens.

6. The system of claim 1, wherein the chiller is integrated into a backpack.

7. The system of claim 1, further comprising a sighting scope operable to allow a human to see at least one of a reflection of the laser or a temperature increase caused by the laser.

8. A portable laser weapon system comprising:
    a carried body including:
        a processor configured to control operation of the laser weapon system;
        a cooling pod containing a phase change material;
        a power source;
        a laser generation module comprising a diode; and
        a heat mitigation module receiving heat from the laser generation module,
        wherein the heat mitigation module utilizes the heat received from the laser generation module to at least partially convert the phase change material from a solid form to a liquid form;
    an emitting unit comprising a lens,
    wherein the emitting unit is configured to be coupled to a firearm;
    a fiber optic cable configured to be coupled to the laser generation module and the emitting unit; and
    an activation mechanism coupled to the firearm,
    wherein the activation mechanism activates the laser generation module when actuated.

9. The system of claim 8, further comprising an intensity control operable to adjust an intensity of a laser generated by the laser generation module.

10. The system of claim 8, wherein the processor prevents the laser generation module from operating until receiving a signal indicating an arming authorization, wherein the arming authorization is selected from a group consisting of a physical key, a fingerprint, and a passcode.

11. The system of claim 8,
    further comprising an inclinometer communicatively coupled to the processor,
    wherein the processor is configured to automatically cease generation of the laser by the laser generation module when the inclinometer determines that the emitting unit is directed above a threshold angle.

12. A portable laser weapon system comprising:
    a carried body including:
        a processor configured to control operation of the laser weapon system;
        a cooling pod containing a phase change material;
        a power source;
        a laser generation module comprising a diode; and
        a heat mitigation module receiving heat from the laser generation module,
        wherein the heat mitigation module utilizes the heat received from the laser generation module to at least partially convert the phase change material from a solid form to a liquid form;

an emitting unit comprising a lens;
a fiber optic cable configured to be coupled to the laser generation module and the emitting unit; and
a chiller,
wherein the chiller is separate from the carried body,
wherein the carried body is configured to dock with the chiller,
wherein the chiller is operable to increase a rate at which the phase change material converts from the liquid form to the solid form.

13. The system of claim 12,
wherein the emitting unit is configured to be coupled to a firearm;
further comprising an activation mechanism coupled to the firearm,
wherein the activation mechanism activates the laser generation module when actuated.

14. The system of claim 12, further comprising an intensity control operable to adjust an intensity of a laser generated by the laser generation module.

15. The system of claim 12,
further comprising an inclinometer communicatively coupled to the processor,
wherein the processor is configured to automatically cease generation of the laser by the laser generation module when the inclinometer determines that the emitting unit is directed above a threshold angle.

16. A portable laser weapon system comprising:
a carried body including:
　a processor configured to control operation of the laser weapon system;
　a cooling pod containing a phase change material;
　a power source;
　a laser generation module comprising a diode; and
　a heat mitigation module receiving heat from the laser generation module,
　　wherein the heat mitigation module utilizes the heat received from the laser generation module to at least partially convert the phase change material from a solid form to a liquid form;
an emitting unit comprising a lens;
a fiber optic cable configured to be coupled to the laser generation module and the emitting unit; and
a chiller,
wherein the chiller is separate from the carried body,
wherein the cooling pod is removable,
wherein the cooling pod is configured to dock with the chiller,
wherein the chiller is operable to increase a rate at which the phase change material converts from the liquid form to the solid form.

17. The system of claim 16,
wherein the emitting unit is configured to be coupled to a firearm;
further comprising an activation mechanism coupled to the firearm,
wherein the activation mechanism activates the laser generation module when actuated.

18. The system of claim 16, further comprising an intensity control operable to adjust an intensity of a laser generated by the laser generation module.

19. The system of claim 16,
further comprising an inclinometer communicatively coupled to the processor,
wherein the processor is configured to automatically cease generation of the laser by the laser generation module when the inclinometer determines that the emitting unit is directed above a threshold angle.

20. A portable laser weapon system comprising:
a laser generation module comprising a diode,
wherein the laser generation module is in either of a laser generation state or a dormant state,
wherein in the laser generation state the laser generation module generates a laser;
a heat mitigation module comprising a phase change material;
a chiller in thermal contact with the heat mitigation module,
wherein the chiller is in either of an active cooling state or a passive cooling state,
wherein in the active cooling state the chiller operates to at least partially increase a rate at which the phase change material converts from a solid form to a liquid form; and
a control module comprising a processor,
wherein the processor is configured to implement one of a plurality of power utilization modes, including:
　a firing mode in which the laser generation module is in the laser generation state and the chiller is in the passive cooling state, and
　a thermal correction mode in which the laser generation module is in the dormant state and the chiller is in the active cooling state.

21. The system of claim 20, wherein the processor is configured to switch the system from the firing mode to the thermal correction mode upon expiration of a timer.

22. The system of claim 20, wherein the processor is configured to switch the system from the firing mode to the thermal correction mode upon receiving a signal indicating that a portion of the system is above a temperature threshold.

23. The system of claim 20,
further including a battery,
wherein the processor is configured to switch the system from the firing mode to the thermal correction mode upon receiving a signal indicating that a charge level of the battery is below a threshold.

24. The system of claim 20,
further including a high usage mode in which the laser generation module is in the laser generation state and the chiller is in the active cooling state,
wherein the processor implements the high usage mode based on a manual selection.

25. The system of claim 20,
further including a wireless communication circuit,
wherein the processor is configured to prevent the system from implementing the firing mode until an arming authorization is received from the wireless communication circuit.

* * * * *